(12) United States Patent
Park et al.

(10) Patent No.: US 6,468,920 B2
(45) Date of Patent: Oct. 22, 2002

(54) METHOD FOR MANUFACTURING CONTACT HOLE IN SEMICONDUCTOR DEVICE

(75) Inventors: Sung-Chan Park; Jun-Dong Kim, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 28 days.

(21) Appl. No.: 09/745,445

(22) Filed: Dec. 26, 2000

(65) Prior Publication Data

US 2001/0006850 A1 Jul. 5, 2001

(30) Foreign Application Priority Data

Dec. 30, 1999 (KR) .............................................. 99-65888

(51) Int. Cl.[7] .............................................. H01L 21/00
(52) U.S. Cl. .................... 438/723; 216/38; 216/79; 216/88; 438/692; 438/734; 438/743
(58) Field of Search .................. 438/692, 712, 438/719, 723, 734, 742, 743, 745; 216/38, 88, 79, 91

(56) References Cited

U.S. PATENT DOCUMENTS 6,057,243 A * 5/2000 Nagayama .............. 438/719 X
6,150,281 A * 11/2000 Kusean .................. 438/734 X
6,329,292 B1 * 12/2001 Hung et al. ............. 438/723 X

* cited by examiner

*Primary Examiner*—William A. Powell
(74) *Attorney, Agent, or Firm*—Jacobson Holman PLLC

(57) ABSTRACT

A method for manufacturing a contact hole in a semiconductor device which includes the steps of preparing an active matrix provided with a substrate and word lines formed on the substrate, forming an etching barrier layer on the word lines and the substrate, forming an interlayer insulating layer on the etching barrier layer, forming a photoresist pattern on the interlayer insulating layer for defining a contact hole, etching the interlayer insulating layer under conditions of low polymerization until the etching barrier layer on the word lines is exposed, etching the interlayer insulating layer under conditions of high polymerization, and etching the interlayer insulating layer under conditions of low polymerization until the etching barrier layer in a bottom of the contact hole is exposed.

5 Claims, 4 Drawing Sheets

METHOD FOR MANUFACTURING CONTACT HOLE IN SEMICONDUCTOR DEVICE

FIELD OF THE INVENTION

The present invention relates to a semiconductor device and, more particularly, to a method for manufacturing a contact hole in the semiconductor device by applying three etching steps.

DESCRIPTION OF THE PRIOR ART

Referring to FIGS. 1A to 1D, there are provided cross sectional views setting forth a conventional method for manufacturing a contact hole using a self align contact (SAC) in a semiconductor device.

The manufacturing steps begin with the preparation of an active matrix provided with a semiconductor substrate 112, word lines 114 formed on the semiconductor substrate 112 and masks 116 formed on top of the word lines 114. An etching barrier layer 118 is then formed on the masks 116 and the semiconductor substrate 112. Thereafter, an interlayer insulating layer 120 is formed over the etching barrier layer 118 and then a top surface of the interlayer insulating layer 120 is flattened by using a chemical mechanical polishing (CMP). Subsequently, a photoresist layer is formed on top of the interlayer insulating layer 120 and patterned into a predetermined configuration, thereby obtaining a patterned photoresist layer 122 as shown in FIG. 1A.

In a next step as shown in FIG. 1B, a first etching step is carried out under conditions of low polymerization, thereby etching upper sides of a contact hole 125 with vertical profiles. While the first etching step is carried out, the polymer 124 is accumulated on the sides of the contact hole.

In an ensuing step, shown in FIG. 1C, a second etching step is carried out under conditions of high polymerization in order to protect the etching barrier layer 118 from etching damage until the etching barrier layer 118 in a bottom portion of the contact hole is exposed. While the second etching step is carried out, more and more polymer 124 accumulates on the sides of the contact hole owing to the narrow space between the word lines. Therefore, a thickness of the etching barrier layer 118 in the bottom portion of the contact hole is decreased gradually by etching attack because the polymer is accumulated on the sides. As the second etching step progresses further as shown in FIG. 1D, the polymer layers on each side of the contact hole eventually stick to each other so that this may serve as an etch stop, whereby the etching step is not performed any longer.

Therefore, the conventional method for manufacturing the contract hole using SAC in the semiconductor device has disadvantages in that the etching barrier layer may be eroded and, further, the etching process cannot be carried out effectively due to sticking of the polymer on the sides of the contact hole.

SUMMARY OF THE INVENTION

It is, therefore, an object of the present invention to provide a method for manufacturing a contact hole in a semiconductor device by applying three etching steps, thereby protecting an etching barrier layer from etching damage in the contact hole.

In accordance with one aspect of the present invention, there is provided a method for manufacturing a contact hole in a semiconductor device, the method comprising the steps of a) preparing an active matrix provided with a substrate and word lines formed on the substrate; b) forming an etching barrier layer on the word lines and the substrate; c) forming an interlayer insulating layer on the etching barrier layer; d) forming a photoresist pattern on the interlayer insulating layer for defining a contact hole; e) etching the interlayer insulating layer under conditions of low polymerization until the etching barrier layer on the word lines is exposed; f) etching the interlayer insulating layer under conditions of high polymerization; and g) etching the interlayer insulating layer under conditions of low polymerization until the etching barrier layer in a bottom of the contact hole is exposed.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Referring to FIGS. 2A to 2D, there are provided cross sectional views setting forth a method for manufacturing a contact hole using a self align contact (SAC) process in a semiconductor device in accordance with a preferred embodiment of the present invention.

Figure 1A:
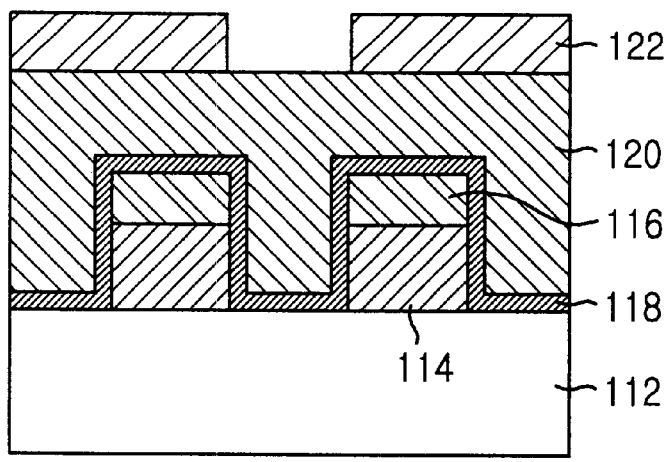
FIGS. 1A to 1D are cross sectional views setting forth a conventional method for manufacturing a contact hole in a semiconductor device.
Figure 1B:
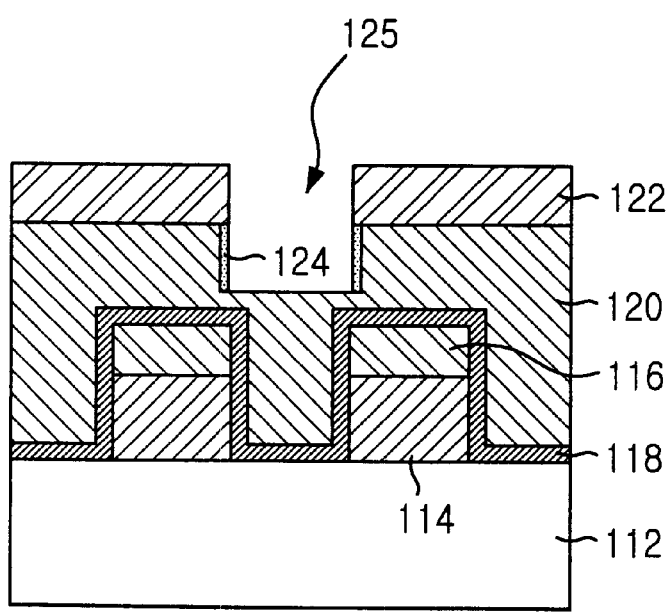
Figure 1C:
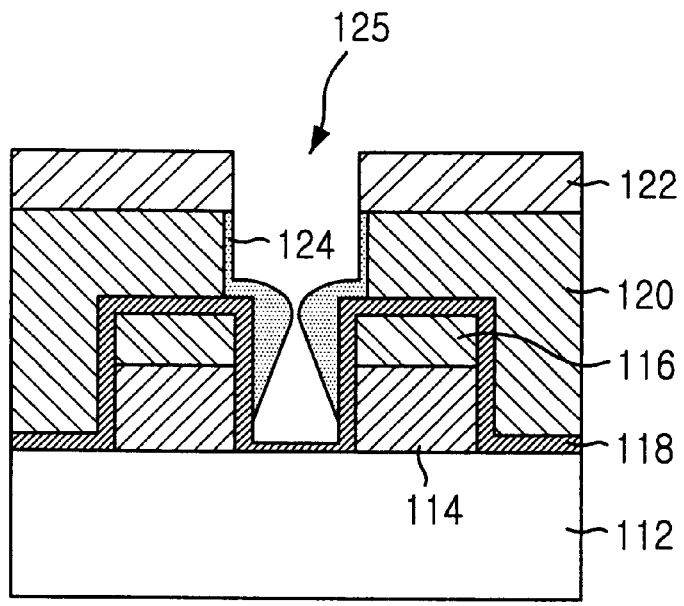
Figure 1D:
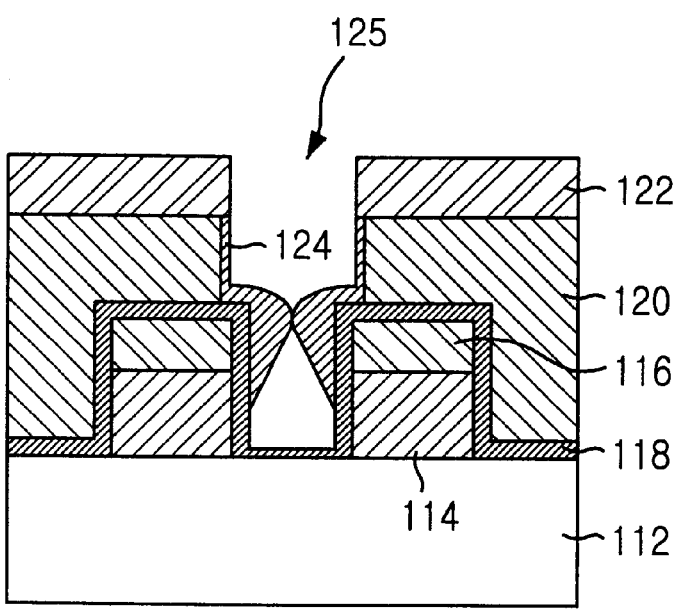
Figure 2A:
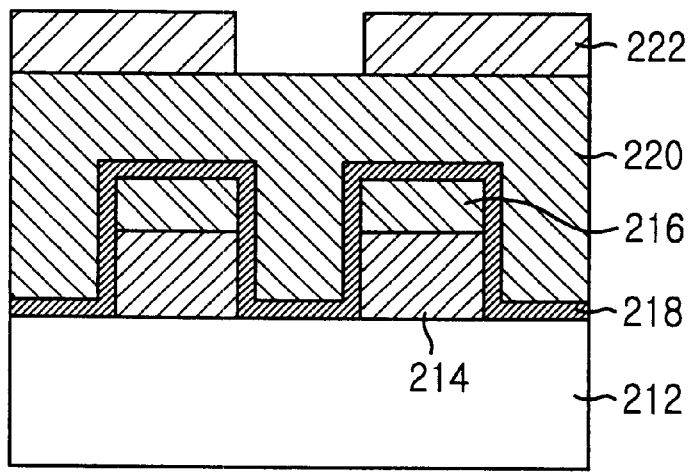
FIGS. 2A to 2D are cross sectional views setting forth a method for manufacturing a contact hole in accordance with a preferred embodiment of the present invention.

The manufacturing steps begin with the preparation of an active matrix provided with a semiconductor substrate 212, word lines 214 formed on the semiconductor substrate 212, and masks 216 formed on top of the word lines 214. An etching barrier layer 218 is then formed on the masks 216 and the semiconductor substrate 212. Thereafter, an interlayer insulating layer 220 is formed over the etching barrier layer 218 and then a top surface of the interlayer insulating layer 220 is flattened by using a chemical mechanical polishing (CMP). Subsequently, a photoresist layer is formed on top of the interlayer insulating layer 220 and patterned into a predetermined configuration, thereby obtaining a patterned photoresist layer 222 as shown in FIG. 2A.

Figure 2B:
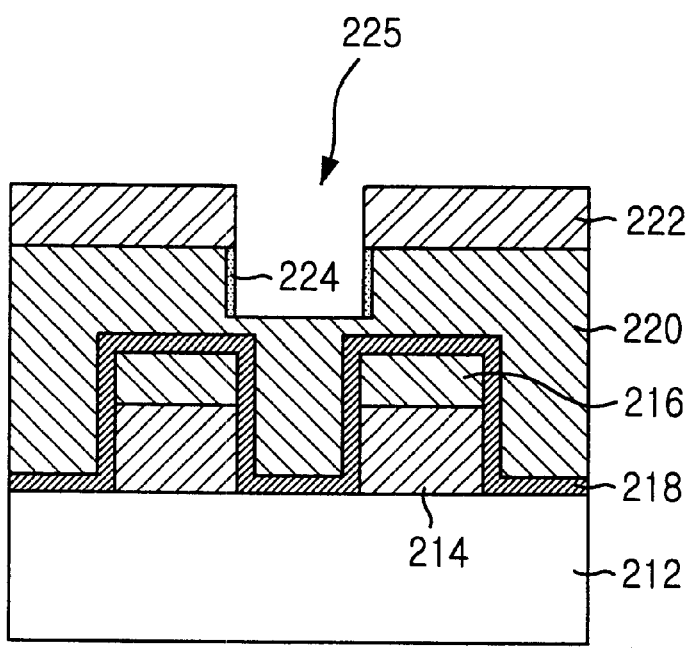

In a next step as shown in FIG. 2B, a first etching step is carried out under conditions of low polymerization, thereby etching upper sides of a contact hole 225 with vertical profiles. While the first etching step is carried out, the polymer 224 is accumulated on the sides of the contact hole.

Figure 2C:
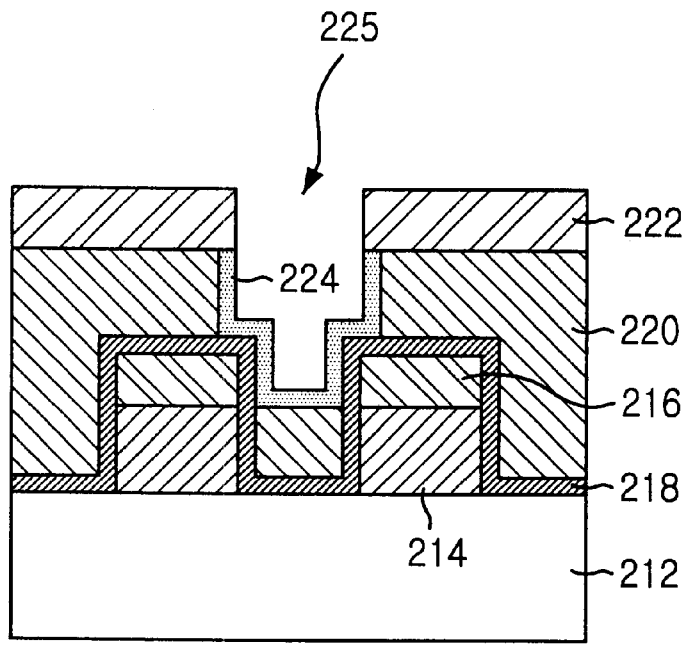

In an ensuing step as shown in FIG. 2C, a second etching step is carried out under conditions of high polymerization in order to protect the etching barrier layer 218 from etching damage.

Figure 2D:
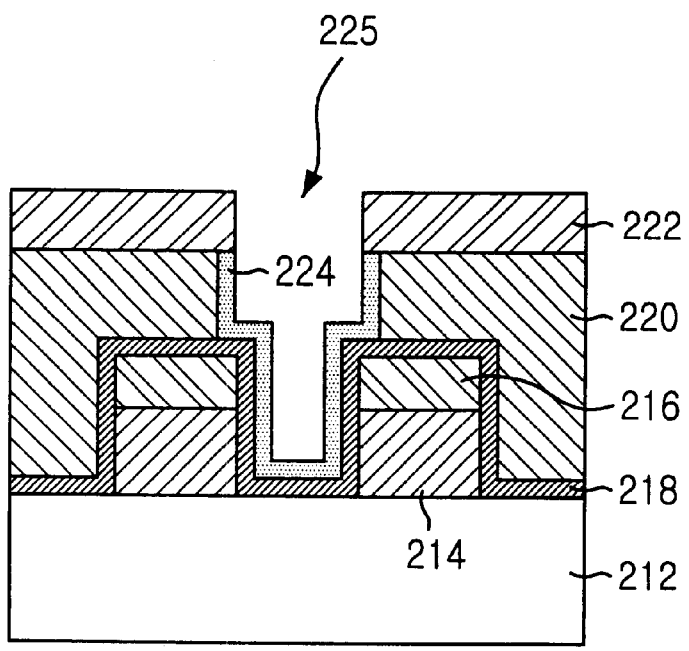

Finally, a third etching step is carried out under conditions of low polymerization and high ion bombardment until the etching barrier layer 218 in a bottom portion of the contact hole is exposed. Thus, the polymer 224 is accumulated on the sides of the contact hole uniformly, as shown in FIG. 2D. In order to improve the ion bombardment effect in the third etching step, the third etching step is carried out by using a high density plasma such as HELICAL, HELICON, ECR (Electron Cyclotron Resonance), TCP (Transformer Coupled Plasma), MERIE (Magnetic Enhanced Reactive Ion Etching), SWP (Surface Wave Plasma) or the like. Further, the third etching step is carried out in a low pressure and a high bias power in order to enhance the ion bombardment effect. In the preferred embodiment of the present invention, the pressure is below 500 mTorr and the applied bias power is at least 1,000 W.

In addition, in order to reduce the polymer produced in the third etching step, it is performed by using a gas with low carbon (C) and high fluorine (F) such as $CF_4$, $C_2F_6$ or the like. In order to reduce the polymer produced, it is also possible to use a small amount of gas such as $CH_3F$, $CH_2F_2$ or the like, which produces a lot of polymer, or not to use the gas at all. It is noted that a temperature of the semiconductor substrate 212 should be kept to 100° C. for depositing the polymer uniformly.

In comparison with the prior art, the present invention provides the method for manufacturing the contact hole in the semiconductor device by applying three etching steps, thereby minimizing a loss of the etching barrier layer and inhibiting an etch stop. That is, by employing the three etching steps in the inventive method, it is possible to prevent the etching barrier layer from etching damage so that the loss of the etching barrier layer can be effectively minimized. Additionally, the third step for etching the lower portion of the contact hole is carried out under conditions of low polymerization so that the etch stop phenomenon does not occur.

While the present invention has been described with respect to the particular embodiments, it will be apparent to those skilled in the art that various changes and modifications may be made without departing from the scope of the invention as defined in the following claims.

What is claimed is:

1. A method for manufacturing a contact hole in a semiconductor device, the method comprising the steps of:
   a) preparing an active matrix provided with a substrate and word lines formed on the substrate;
   b) forming an etching barrier layer on the word lines and the substrate;
   c) forming an interlayer insulating layer on the etching barrier layer;
   d) forming a photoresist pattern on the interlayer insulating layer for defining a contact hole;
   e) etching the interlayer insulating layer under conditions of low polymerization until the etching barrier layer on the word lines is exposed;
   f) etching the interlayer insulating layer under conditions of high polymerization; and
   g) etching the interlayer insulating layer under conditions of low polymerization until the etching barrier layer in a bottom of the contact hole is exposed.

2. The method as recited in claim 1, wherein the step g) is carried out by using a high density plasma (HDP).

3. The method as recited in claim 2, wherein the step g) is carried out under conditions that a pressure is below 50 mTorr and a bias power is at least 1,000 W.

4. The method as recited in claim 3, wherein the step g) is carried out using an etchant selected from the group consisting of $CF_4$ and $C_2F_6$.

5. The method as recited in claim 4, wherein the step g) is carried out under conditions that a temperature of the substrate is at least 100° C.

* * * * *